United States Patent [19]
Wottrich

[11] Patent Number: 5,969,516
[45] Date of Patent: Oct. 19, 1999

[54] ELECTRICAL CIRCUIT INTERRUPTER DEVICE LOCATOR

[75] Inventor: Joachim Wottrich, Hamburg-Norderstedt, Germany

[73] Assignee: NTC, Inc., Morris, Ill.

[21] Appl. No.: 08/900,992

[22] Filed: Jul. 25, 1997

[51] Int. Cl.[6] .......... G01R 19/00; G01R 31/02; G01R 19/145
[52] U.S. Cl. .............. 324/67; 324/66; 324/508; 324/529
[58] Field of Search .................. 324/508, 529, 324/66, 67; 340/638, 654, 656

[56] References Cited

U.S. PATENT DOCUMENTS

| | | | |
|---|---|---|---|
| 4,082,995 | 4/1978 | Rhude | 324/508 |
| 4,121,152 | 10/1978 | Hale et al. | 324/66 |
| 4,129,825 | 12/1978 | Brinegar | 324/66 X |
| 4,556,839 | 12/1985 | George | 324/66 |
| 4,734,638 | 3/1988 | Weber | 324/66 |
| 4,775,832 | 10/1988 | Pecukonis | 324/67 |
| 4,801,868 | 1/1989 | Brooks | 324/66 |
| 4,804,907 | 2/1989 | Pecukonis | 324/67 |
| 4,906,938 | 3/1990 | Konopka | 324/66 X |
| 5,422,564 | 6/1995 | Earle et al. | 324/67 |
| 5,493,206 | 2/1996 | Boons | 324/66 |
| 5,497,094 | 3/1996 | George | 324/66 |
| B1 4,906,938 | 2/1995 | Konopka | 324/66 X |

FOREIGN PATENT DOCUMENTS 1162811  8/1969  United Kingdom ............ 324/66

*Primary Examiner*—Gerard Strecker
*Attorney, Agent, or Firm*—Wallenstein & Wagner, Ltd.

[57] ABSTRACT

The present invention relates to an electronic system for identifying the circuit interrupter device associated with a particular power outlet receptacle on a power line, and to a method or means for identifying the circuit interrupter device.

22 Claims, 4 Drawing Sheets

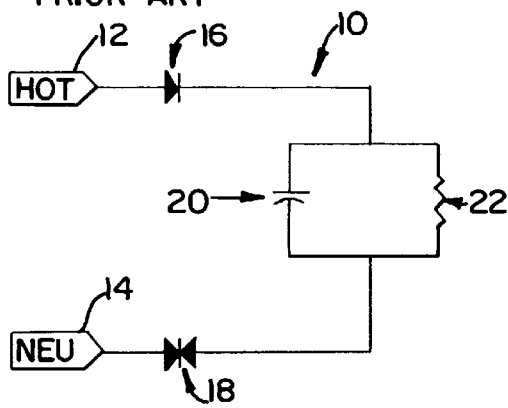
FIG. 1
PRIOR ART
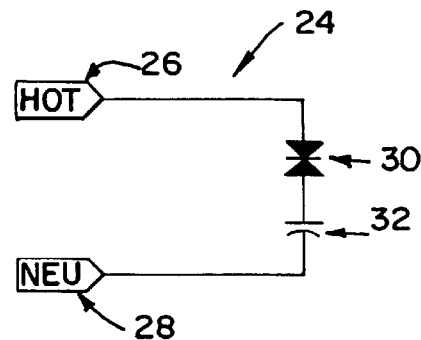
FIG. 2
FIG. 3A
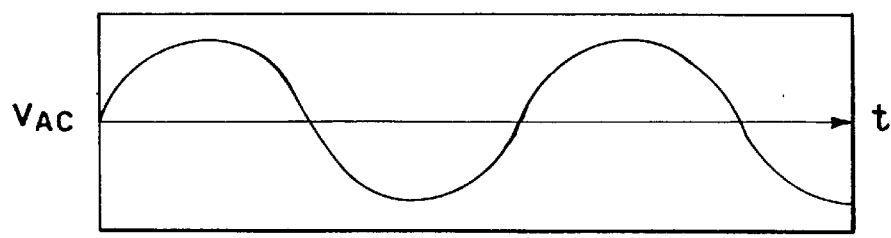
FIG. 3B
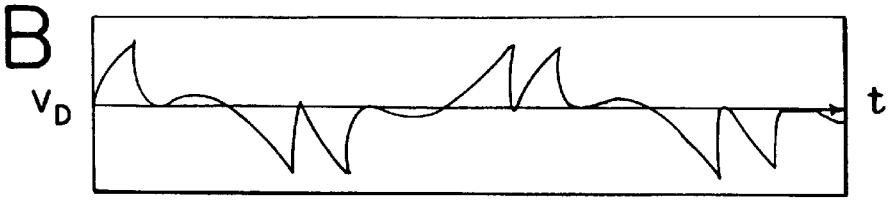
FIG. 3C
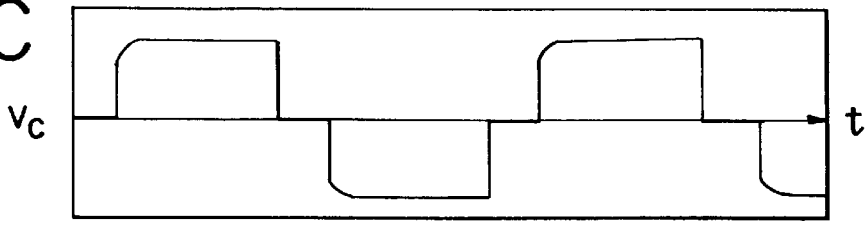
FIG. 3D
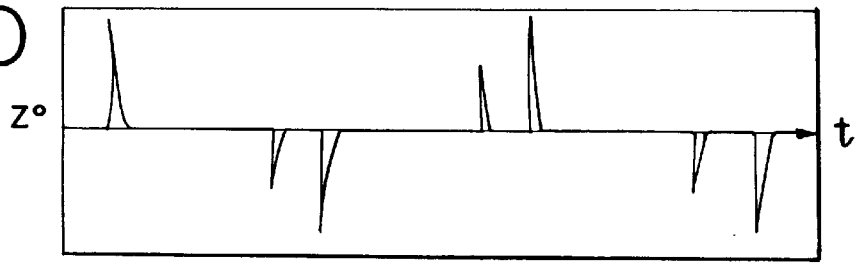

ELECTRICAL CIRCUIT INTERRUPTER DEVICE LOCATOR

TECHNICAL FIELD

The present invention relates generally to AC power line testing equipment and, more particularly, to an AC power circuit identifying device. Specifically, the present invention is used to identify the circuit interrupter device associated with a particular power outlet receptacle.

BACKGROUND OF THE INVENTION

When work is performed on an electrical system in a building or facility, it is necessary to trace and identify which circuit interrupter device (e.g., circuit breaker or fuse) is supplying power to a particular power outlet receptacle or electrical component. Manual identification of the fuse or circuit breaker can be accomplished by removing each fuse or opening each circuit breaker, thereby disrupting the power flow through the circuit. Each outlet must subsequently be examined to determine whether the power to the outlet has been disconnected. This method is not only time consuming, but also may not be feasible in situations where it would be hazardous to interrupt the power flow to certain outlets, e.g., in a hospital or in an environment where computers are in use with no backup power.

Alternatively, a variety of circuit testers are available for identifying the fuse or circuit breaker that is supplying power to a particular outlet receptacle. These testers employ an assortment of techniques to distinguish one circuit breaker from the rest. For example, the testers disclosed in U.S. Pat. Nos. 4,906,938 and 5,497,094 use a relaxation oscillator to apply an identification signal comprising a large amplitude current pulse of very short duration to the circuit. A schematic diagram of the transmitter 10 disclosed in U.S. Pat. No. 4,906,938 is shown in FIG. 1. The terminals 12, 14 of transmitter 10 are connected to the outlet or light fixture to be tested. Diode 16 acts as a half-wave rectifier. Specifically, if the voltage across diode 16 is positive, diode 16 acts as a short circuit, and if the voltage across diode 16 is negative, diode 16 acts as an open circuit. Sidac 18 is a short circuit when the voltage thereacross reaches its threshold value of 120–135 volts, and is an open circuit when the current through sidac 18 drops below the minimum holding current of the device. Thus, in this arrangement, sidac 18 acts as a trigger switch.

If a conventional power line voltage is applied to transmitter 10, sidac 18 will initially go into conduction when the line voltage reaches approximately 120 volts. This causes capacitor 20 to immediately charge to the line voltage, resulting in a large amplitude current pulse which is used to identify the circuit. Sidac 18 will continue conducting until the current approaches 0 amps, i.e., approximately 50–150 milliamps, which occurs near the peak of the power line voltage. When sidac 18 is switched off, capacitor 20 will be charged at a voltage level close to the peak voltage, i.e., approximately 150 volts, and can only discharge through resistor 22. Due to the relatively large resistance of resistor 22, the discharge of capacitor 20 will be slow.

Because capacitor 20 remains charged at approximately 150 volts, as the line voltage decreases from 150 volts to 0 volts and continues through its negative cycle, the voltage across diode 16 is negative. Thus, diode 16 remains an open circuit and capacitor 20 continues to discharge slowly through resistor 22.

During the next cycle, diode 16 becomes a short circuit when the line voltage surpasses the charge on the capacitor 20. Sidac 18 will remain an open circuit, however, because the voltage across sidac 18, which is the difference between the line voltage and the voltage across capacitor 20, will not reach its threshold value. Thus, transmitter 10 will not conduct any current until the voltage across capacitor 20 has time to discharge through resistor 22, which does not occur for a number of cycles. This results in a frequency of current spikes less than the power line frequency of 60 hertz.

Other conventional testers introduce a high frequency, low amplitude signal onto the current flowing through the power line. These devices are subject to false indications resulting from spurious signals from transients and switching currents, and require a sensitive receiver to pick up the magnetic field created by the low amplitude current flowing through the circuit. In addition, the capability for discriminating between closely adjacent current-carrying conductors, for example, adjacent circuit breakers in a breaker box, is reduced in these types of testers.

Another drawback associated with the conventional testers described above is that they will not operate if the outlet has been wired incorrectly. Thus, although devices are available which indicate any incorrect wiring, conventional testers cannot be used to identify the fuse or circuit breaker associated with a particular outlet unless the wiring of the outlet is correctly installed.

SUMMARY OF THE INVENTION

The present invention is directed to an electronic system for identifying a power line associated with a particular outlet receptacle. Particularly, a transmitting device is plugged into the power outlet receptacle in question, and an identification signal is drawn over the circuit wiring from the electrical panel.

According to a first aspect of the present invention, current spikes are drawn on the power line at the frequency of the oscillating signal on the power line to produce a magnetic field. A receiver senses the magnetic field, and a user is alerted.

According to a second aspect of the present invention, an identification signal can be formed across any one of three terminals associated with the outlet receptacle to produce a magnetic field. A receiver senses the magnetic field, and a user is alerted.

Although the present invention is described to identify a circuit interrupter device, it will be understood that the present invention may also be used to identify and locate wires hidden behind solid objects, such as walls. The present invention discloses a system which does not necessitate interrupting the circuit or any other circuits.

Other features and advantages of the invention will be apparent from the following detailed description taken in conjunction with the drawings.

BRIEF DESCRIPTION OF THE DRAWINGS

FIG. 1 is a schematic diagram of a conventional transmitting device.

FIG. 2 is a schematic diagram of a first embodiment of a transmitting device in accordance with the present invention.

FIG. 3A is a waveform diagram illustrating the voltage across the transmitting device of FIG. 2.

FIG. 3B is a waveform diagram illustrating the voltage across the diac of FIG. 2.

FIG. 3C is a waveform diagram illustrating the voltage across the capacitor of FIG. 2.

FIG. 3D is a waveform diagram illustrating the current drawn by the transmitting device of FIG. 2.

DETAILED DESCRIPTION OF THE PREFERRED EMBODIMENT

Figure 4:
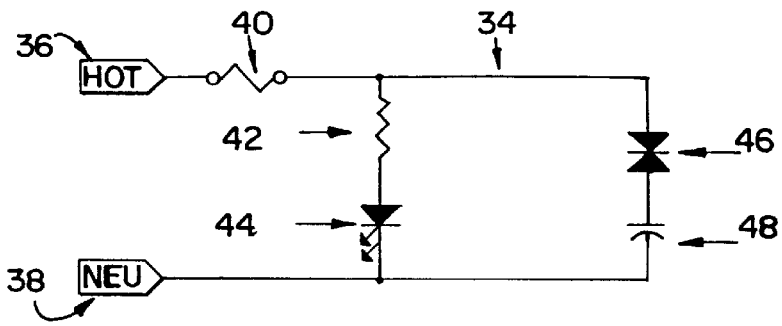
FIG. 4 is a schematic diagram of a second embodiment of a transmitting device in accordance with the present invention.

While this invention is susceptible of embodiments in many different forms, there will herein be described in detail preferred embodiments of the invention with the understanding that the present disclosure is to be considered as exemplifications of the principles of the invention and is not intended to limit the broad aspects of the invention to the embodiments illustrated.

FIG. 2 is a schematic diagram of a transmitting device 24 in accordance with the present invention. The terminals 26, 28 of transmitting device 24 are connected to the outlet or electrical fixture to be tested, where terminal 26 is the hot terminal and terminal 28 is the neutral terminal. Diac 30 in series with capacitor 32 is connected across terminals 26, 28.

In operation, when a conventional power line voltage is applied to transmitting device 24, diac 30 will initially go into conduction when the line voltage reaches approximately 120 volts. Diac 30 switches on through a negative resistance region to a low on-state voltage. This causes capacitor 32 to immediately charge to the line voltage, resulting in a large amplitude current pulse which is used to identify the circuit. Diac 30 will continue conducting until the current approaches 0 amps, which occurs near the peak of the power line voltage. When diac 30 is switched off, capacitor 32 will be charged at a voltage level close to the peak voltage, i.e., approximately 150 volts.

As the power line voltage decreases from 150 volts to approximately 30 volts, the voltage across diac 30, which is the difference between the line voltage and the voltage across capacitor 32, does not exceed its threshold voltage. Thus, diac 30 remains an open circuit and capacitor 32 remains charged. When the line voltage reaches approximately 30 volts, the voltage across diac 30 reaches approximately -120 volts. Thus, diac 30 becomes a short circuit, allowing capacitor 32 to discharge quickly through terminal 28 and result in a negative current spike. Due to the limited charge on capacitor 32, the negative current spike may be smaller than the positive current spike created when charging capacitor 32. As the capacitor 32 discharges to 0 volts, diac 30 again becomes an open circuit.

A similar pattern will result in the opposite direction for the negative line voltages. Thus, bidirectional current spikes are formed. This continuous action results in the formation of an identification signal on the circuit, which produces a corresponding magnetic field around the signal carrying the wire. Thus, diac 30 controls the charging of capacitor 32, which serves as the waveshaper of the unit. Preferably, diac 30 is manufactured by Teccor and marketed under part number P1100EA70. With P1100EA70, diac 30 will go into conduction when the line voltage reaches approximately ±90–125 volts.

FIGS. 3A–D illustrate the voltages across transmitting device 24, diac 30 and capacitor 32, and the current drawn by transmitting device 24 of FIG. 2 over time.

FIG. 4 is a schematic diagram of a second embodiment of a transmitting device 34 in accordance with the present invention. The terminals 36, 38 of transmitting device 34 are connected to the outlet or electrical fixture to be tested. Fuse 40 protects the device 34 from any kind of damage caused by component failure, power surge, etc. Resistor 42 and LED 44 are connected in series across terminals 36, 38. Diac 46 in series with capacitor 48 is also connected across terminals 36, 38.

LED 44 in transmitting device 34 indicates when the transmitting device 34 is powered. In all other respects, transmitting device 34 is the same as transmitting device 24 illustrated in FIG. 2.

Figure 5:
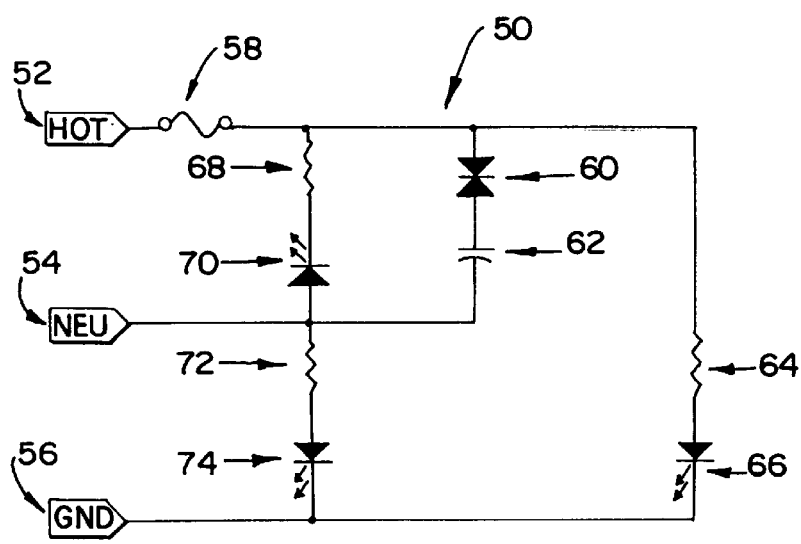
FIG. 5 is a schematic diagram of a third embodiment of a transmitting device in accordance with the present invention.

FIG. 5 is a schematic diagram of a third embodiment of a transmitting device 50 in accordance with the present invention. The terminals 52, 54, 56 of transmitting device 50 are connected to the outlet or electrical fixture to be tested, where terminal 52 is the hot terminal, terminal 54 is the neutral terminal, and terminal 56 is connected to ground. Fuse 58 protects the device 50 from any kind of damage caused by component failure, power surge, etc. Diac 60 in series with capacitor 62 is connected across terminals 52, 54. Resistor 64 and LED 66 are connected in series across terminals 52, 56. Resistor 68 and LED 70 are connected in series across terminals 52, 54. Resistor 72 and LED 74 are connected in series across terminals 54, 56.

Transmitting device 50 has two more LEDs than transmitting device 34. In all other respects, transmitting devices 34 and 50 are the same. LEDs 66, 70, 74 in transmitting device 50 indicate whether the electrical connections to terminals 52, 54, 56 are correct. Specifically, the possible connections and the resulting LED indications are shown in Table I below.

TABLE I

| $LED_{66}$ | $LED_{70}$ | $LED_{74}$ | CONNECTION |
|---|---|---|---|
| ON | ON | OFF | CORRECT WIRING |
| OFF | ON | OFF | OPEN GROUND |
| ON | OFF | OFF | OPEN NEUTRAL |
| OFF | OFF | OFF | OPEN HOT |
| ON | OFF | ON | HOT/GROUND REVERSED |
| OFF | ON | ON | HOT/NEUTRAL REVERSED |

Figure 6:
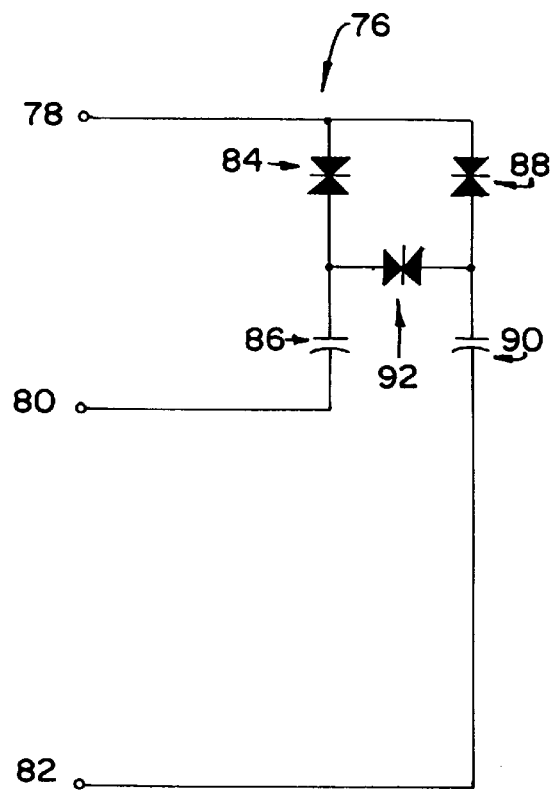
FIG. 6 is a schematic diagram of a fourth embodiment of a transmitting device in accordance with the present invention.

FIG. 6 is a schematic diagram of a fourth embodiment of a transmitting device 76 in accordance with the present invention. Terminals 78, 80, 82 of transmitting device 76 are connected to the outlet or electrical fixture to be tested. Diac 84 in series with capacitor 86 is connected across terminals 78, 80. Diac 88 in series with capacitor 90 is connected across terminals 78, 82. Capacitor 86 in series with diac 92 and capacitor 90 is connected across terminals 80, 82.

Transmitting device 76 is designed to form an identification signal on any one of the three terminals 78, 80, 82. Thus, if the outlet has been incorrectly wired, transmitting device 76 will still form an identification signal on the circuit. If terminal 78 is the hot terminal and terminal 80 is the neutral terminal, the identification signal is created by diac 84 and capacitor 86. If terminal 78 is the hot terminal and terminal 82 is the neutral terminal, the identification signal is created by diac 88 and capacitor 90. If terminal 80 is the hot terminal and terminal 82 is the neutral terminal, the identification signal is created by diac 92 and capacitors 86, 90.

Figure 7:
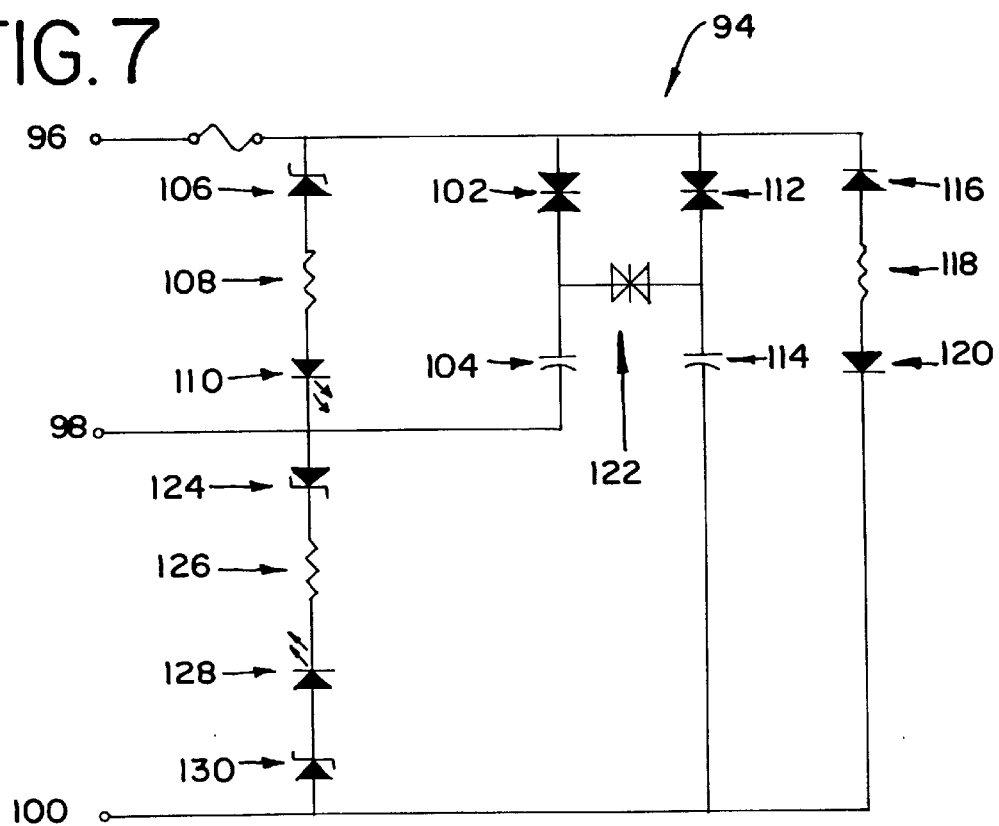
FIG. 7 is a schematic diagram of a fifth embodiment of a transmitting device in accordance with the present invention.

FIG. 7 is a schematic diagram of a fifth embodiment of a transmitting device 94 in accordance with the present invention. Terminals 96, 98, 100 of transmitting device 94 are connected to the outlet or electrical fixture to be tested. Diac 102 in series with capacitor 104 is connected across terminals 96, 98. Zener diode 106 in series with resistor 108 and LED 110 is also connected across terminals 96, 98. Diac 112 in series with capacitor 114 is connected across terminals 96, 100. Zener diode 116 in series with resistor 118 and LED 120 is also connected across terminals 96, 100. Capacitor 104 in series with diac 122 and capacitor 114 is connected across terminals 98, 100. Zener diode 124 in series with resistor 126, LED 128 and zener diode 130 is also connected across terminals 98, 100.

LEDs 110, 120, 128 in transmitting device 94 indicate a connection from the hot terminal. Zener diodes 106, 116, 124, 130 prevent the dimming of LEDs 110, 120, 128. Thus, transmitting device 94 not only acts as a transmitter, but also indicates whether the wiring is incorrect. Specifically, the wiring to the hot terminal and the resulting LED indications are shown in Table II below.

TABLE II

| Hot Terminal | $LED_{110}$ | $LED_{120}$ | $LED_{128}$ |
|---|---|---|---|
| 96 | ON | ON | OFF |
| 98 | ON | OFF | ON |
| 100 | OFF | ON | ON |

In all other respects, transmitting devices 76 and 94 are the same. Therefore, transmitting device 94 is designed to modify the shape of the alternating current signal through the circuit, thus altering the magnetic field around the signal carrying the wire, even if the outlet has been incorrectly wired.

Figure 8:
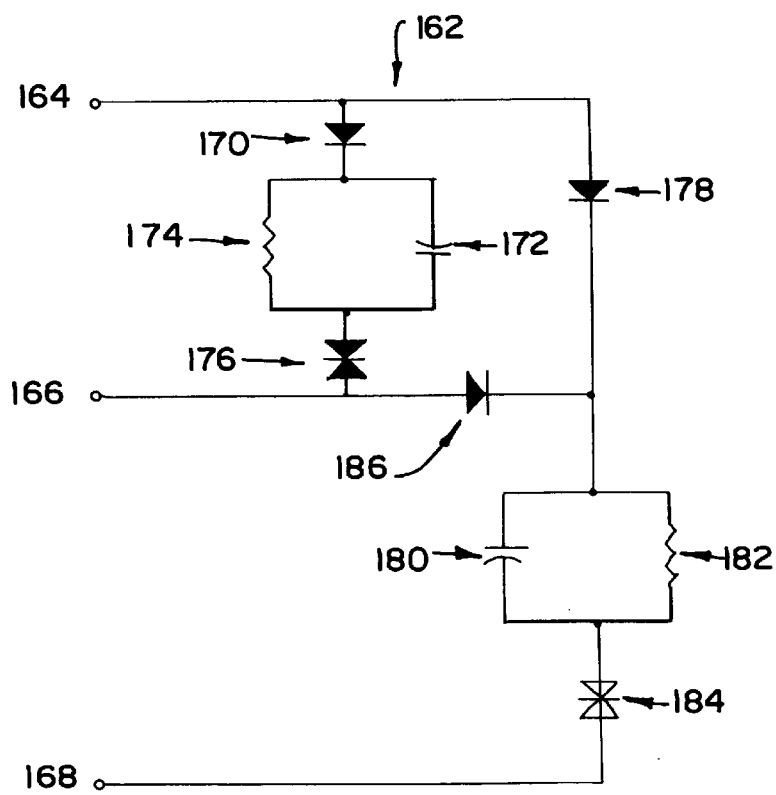
FIG. 8 is a schematic diagram of a sixth embodiment of a transmitting device in accordance with the present invention.

FIG. 8 is a schematic diagram of a sixth embodiment of a transmitting device 162 in accordance with the present invention. The terminals 164, 166, 168 of transmitting device 162 are connected to the outlet or electrical fixture to be tested. Diode 170 in series with the parallel combination of capacitor 172 and resistor 174, and in series with diac 176, is connected across terminals 164, 166. Diode 178 in series with the parallel combination of capacitor 180 and resistor 182, and in series with diac 184, is connected across terminals 164, 168. Diode 186 in series with the parallel combination of capacitor 180 and resistor 182, and in series with diac 184, is connected across terminals 164, 168.

Transmitting device 162 forms an identification signal similar to that formed in device 10 of FIG. 1. Transmitting device 162, however, is designed to form an identification signal from any one of terminals 164, 166, 168. Therefore, similar to transmitting devices 76, 94, if the outlet has been incorrectly wired, transmitting device 162 will still form an identification signal on the circuit. Similar to the fifth embodiment in FIG. 7, LEDs in series with resistors and zener diodes may be connected across the terminals to indicate whether the electrical wiring has been incorrectly installed.

Figure 9:
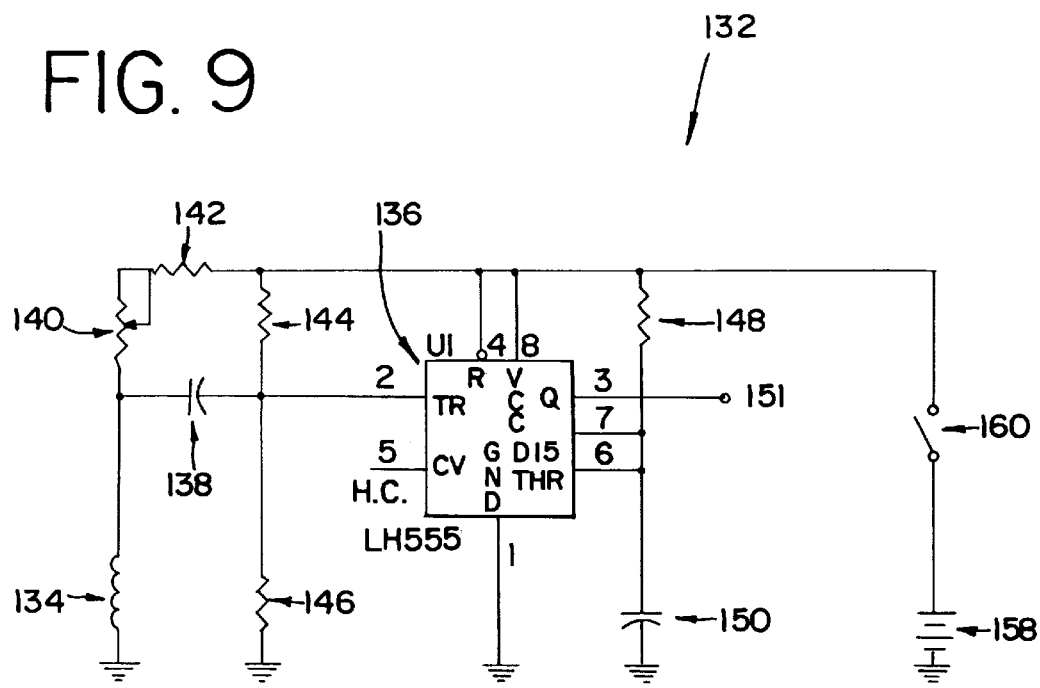
FIG. 9 is a schematic diagram of a receiving device in accordance with the present invention.

FIG. 9 is a schematic diagram of a receiving device 132 in accordance with the present invention. Pickup coil or inductor 134 detects the desired magnetic field around the circuit interrupter devices. One end of pickup coil 134 is connected to ground, while the other end is connected to PIN2 of timer 136 through capacitor 138. Timer 136 may be a conventional LM555 timer. In the preferred embodiment, the CMOS version of an LM555 timer, i.e., an ICM 7555, is used. As is well known in the art, an LM555 timer implements a monostable or astable multivibrator which generates a pulse in response to a trigger signal. PIN2 is the input of timer 136. The second end of pickup coil 134 is connected to potentiometer 140 in series with resistor 142 to PIN4 and PIN8 of timer 136. PIN4 and PIN8 are connected to PIN2 through resistor 144. PIN2 is also connected to ground through resistor 146. PIN6 and PIN7 of timer 136 are connected to PIN4 and PIN8 through resistor 148. PIN6 and PIN7 are also connected to ground through capacitor 150.

Figure 10:
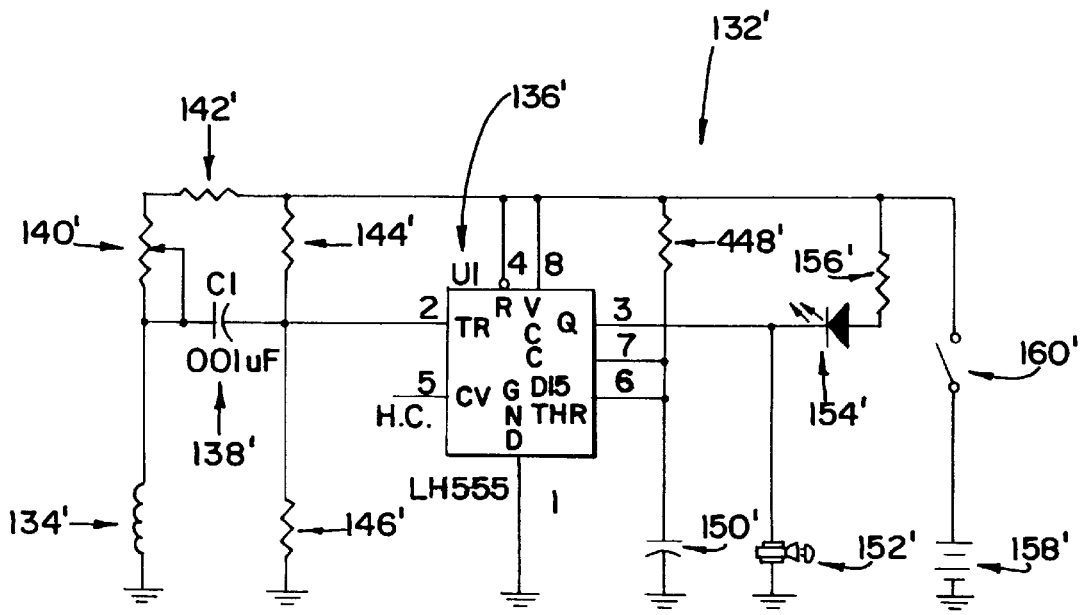
FIG. 10 is a schematic diagram of the receiving device of FIG. 9 with an audio and visual alarm connected to the output of the receiving device.

PIN3 is the output 151 of timer 136. Thus, PIN3 may be connected to audio alarm 152' or LED 154' in series with resistor 156' to PIN4 and PIN8, as shown in FIG. 10. PIN4 and PIN8 are also connected to battery 158 through switch 160.

The receiving device 132 operates as a field strength indicator. Since the D.C. resistance of an inductor is close to 0 ohms, resistor 142 is provided to prevent a short across the voltage lines if potentiometer 140 is at the lower end of its resistance range.

When pickup coil 134 senses an electromagnetic field of a sufficient intensity, a current will flow due to electromagnetic induction. This creates a voltage across the potentiometer 140, and thus, a voltage across pickup coil 134, which follow the pattern of the field strength. Thus, an alternating signal is AC-coupled through capacitor 138 to the junction of resistor 144, resistor 146 and PIN2 of timer 136. The sensitivity of the circuit can be controlled by potentiometer 140, which is manually adjustable to vary the voltage across pickup coil 134. Potentiometer 140 allows the voltage across coil 134 to be pulled up to a level which approaches the positive supply voltage limited only by the value of resistor 142.

Due to the nature of the voltage divider formed by resistors 144, 146, the voltage on PIN2 of timer 136 may be set at a predetermined value. In the preferred embodiment, this value is slightly above one-third of the circuit supply voltage. Since timer 136 is triggered by a negative going edge of the input signal on PIN2, i.e., it is triggered by a decrease in the voltage applied to PIN2, timer 136 will trigger as soon as the appearance of a signal sensed by pickup coil 134 causes a negative pulse relative to the predetermined voltage on PIN2 of timer 136. In other words, timer 136 will trigger as soon as the voltage on PIN2 of timer 136 decreases to less than approximately one-third of the supply voltage.

Capacitor 150 and resistor 148 determine the time period, $\tau$, of the receiving device 132, where R is the value of resistor 148, C is the value of capacitor 150, and $\tau=1.1$ RC. Although the supply current consumed by the ICM 7555 device is very low, the total system supply can be high unless the timing components 148, 150 have high impedances. Thus, a high value for resistor 148 and a low value for capacitor 150 are typically chosen.

Pickup coil 134 in receiving device 132 detects the identification signal, e.g., the current waveform shown in FIG. 3D, and triggers timer 136. Timer 136 is designed as a monostable oscillator with a very short timing rate. As soon as timer 136 is triggered by the coil 134, it activates an audible signal and/or a visible signal. LED 154', in series with current limiting resistor 156', is the visible indicator for the signal, while buzzer 152' is the audible indicator.

It will be understood that the invention may be embodied in other specific forms without departing from the spirit or central characteristics thereof. The present embodiments, therefore, are to be considered in all respects as illustrative and not restrictive, and the invention is not to be limited to the details given herein.

What I claim is:

1. An electronic system for identifying a power line associated with an outlet, wherein the power line carries an oscillating signal at a given frequency, the electronic system comprising:

drawing means connected to the outlet to form a circuit with the power line for drawing bidirectional current spikes from the circuit to produce a magnetic field around the power line;

sensing means for sensing the magnetic field; and alert means for alerting a user when said sensing means senses the magnetic field.

2. The electronic system as claimed in claim 1, wherein said drawing means is responsive to an oscillating voltage across the power line.

3. The electronic system as claimed in claim 1, further comprising converting means for converting the magnetic field into a value proportional to the strength of the magnetic field, wherein said alert means alerts the user when the value proportional to the strength of the magnetic field is greater than a minimum value.

4. The electronic system as claimed in claim 3, further comprising amplifying means for amplifying the value proportional to the strength of the magnetic field.

5. The electronic system as claimed in claim 1, wherein the outlet has three terminals, said drawing means connects at least two terminals of the outlet, and said drawing means can draw current spikes from one of the connected terminals.

6. The electronic system as claimed in claim 5, wherein said drawing means is responsive to an oscillating voltage across the power line.

7. The electronic system as claimed in claim 6, further comprising means for indicating which of the terminals is carrying the oscillating voltage.

8. A transmitting device in an electronic system for identifying a power line associated with an outlet, wherein the power line carries an oscillating signal at a given frequency and the transmitting device is connected to the outlet to form a circuit with the power line, the transmitting device comprising:

drawing means for drawing bidirectional current spikes from the circuit to produce a magnetic field around the power line.

9. The transmitting device as claimed in claim 8, wherein said drawing means is responsive to an oscillating voltage across the power line.

10. The transmitting device as claimed in claim 8, wherein the outlet has three terminals, the transmitting device connects at least two terminals of the outlet, and said drawing means can draw current spikes from one of the connected terminals.

11. The transmitting device as claimed in claim 10, wherein said drawing means is responsive to an oscillating voltage across the power line.

12. The transmitting device as claimed in claim 11, further comprising means for indicating which of the terminals is carrying the oscillating voltage.

13. A method for identifying a power line associated with an outlet, wherein the power line carries an oscillating signal at a given frequency, and a transmitting device is connected to the outlet to form a circuit with the power line, the method comprising the steps of:

drawing bidirectional current spikes from the circuit to produce a magnetic field around the power line;

sensing the magnetic field; and alerting a user when the magnetic field is sensed.

14. The method as claimed in claim 13, wherein the current spikes are drawn responsive to an oscillating voltage across the power line.

15. The method as claimed in claim 13, further comprising the step of converting the magnetic field into a value proportional to the strength of the magnetic field, wherein the user is alerted when the value proportional to the strength of the magnetic field is greater than a minimum value.

16. The method as claimed in claim 15, further comprising the step of amplifying the value proportional to the strength of the magnetic field.

17. The method as claimed in claim 13, wherein the outlet has three terminals, the transmitting device connects at least two terminals of the outlet, and the current spikes are drawn from one of the connected terminals.

18. The method as claimed in claim 17, wherein the current spikes are drawn responsive to an oscillating voltage across the power line.

19. The method as claimed in claim 18, further comprising the step of indicating which of the terminals is carrying the oscillating voltage.

20. The electronic system as claimed in claim 1, wherein said drawing means draws the current spikes at the given frequency.

21. The transmitting device as claimed in claim 8, wherein said drawing means draws the current spikes at the given frequency.

22. The method as claimed in claim 13, wherein the current spikes are drawn at the given frequency.

* * * * *